(12) United States Patent
Chin-Chen

(10) Patent No.: US 10,683,673 B2
(45) Date of Patent: Jun. 16, 2020

(54) CAULKING ASSISTING DEVICE

(71) Applicant: Huang Chin-Chen, Taichung (TW)

(72) Inventor: Huang Chin-Chen, Taichung (TW)

( * ) Notice: Subject to any disclaimer, the term of this patent is extended or adjusted under 35 U.S.C. 154(b) by 0 days.

(21) Appl. No.: 16/175,763

(22) Filed: Oct. 30, 2018

(65) Prior Publication Data

US 2020/0131789 A1  Apr. 30, 2020

(51) Int. Cl.
| | | |
|---|---|---|
| *B29C 65/00* | (2006.01) | |
| *E04G 23/02* | (2006.01) | |
| *H05K 13/04* | (2006.01) | |
| *B32B 38/10* | (2006.01) | |
| *H05K 13/02* | (2006.01) | |
| *B32B 43/00* | (2006.01) | |
| *B44C 7/02* | (2006.01) | |
| *B65H 35/00* | (2006.01) | |
| *B44C 7/04* | (2006.01) | |
| *B44C 7/06* | (2006.01) | |
| *B65H 37/00* | (2006.01) | |
| *E04F 21/165* | (2006.01) | |
| *B44C 7/08* | (2006.01) | |

(52) U.S. Cl.
CPC ........ *E04G 23/0214* (2013.01); *B29C 66/861* (2013.01); *B32B 38/10* (2013.01); *B32B 43/006* (2013.01); *B44C 7/02* (2013.01); *B44C 7/04* (2013.01); *B44C 7/06* (2013.01); *B44C 7/08* (2013.01); *B65H 35/0046* (2013.01); *B65H 35/0053* (2013.01); *B65H 37/007* (2013.01); *E04F 21/1657* (2013.01); *H05K 13/02* (2013.01); *H05K 13/0417* (2013.01); *H05K 13/0419* (2018.08); *Y10T 156/1184* (2015.01); *Y10T 156/179* (2015.01); *Y10T 156/1788* (2015.01); *Y10T 156/1795* (2015.01); *Y10T 156/1961* (2015.01); *Y10T 156/1967* (2015.01)

(58) Field of Classification Search
CPC ...... B29C 66/861; E04F 21/1657; B44C 7/02; B44C 7/04; B44C 7/06; B44C 7/08; B65H 35/0046; B65H 35/0053; B65H 37/007; Y10T 156/1788; Y10T 156/179; Y10T 156/1795
USPC .................. 156/574, 577, 579; 118/123, 413
See application file for complete search history.

(56) References Cited

U.S. PATENT DOCUMENTS

| | | | | |
|---|---|---|---|---|
| 3,880,701 | A * | 4/1975 | Moree | B44C 7/04 156/526 |
| 3,948,549 | A * | 4/1976 | Duran | E05B 67/365 292/26 |
| 4,003,781 | A * | 1/1977 | Holsten | E04F 21/165 156/526 |

(Continued)

*Primary Examiner* — Philip C Tucker
*Assistant Examiner* — Nickolas R Harm

(57) ABSTRACT

A caulking assisting device has of a fixed frame mounted to a filler coating-supplying device, a rolling part mounted to the fixed frame, a movable frame and an elastic element. The positioning frame has a pair of first limiting recesses and a pair of second limiting recesses. The movable frame is pivoted to the fixed frame and is rotatable, and a tapered roller is pivoted at the end of the movable frame. Meanwhile, the elastic element is disposed on the movable frame, while a positioning protrusion is located at both ends respectively. As a result, the tapered roller can be moved to a use position and a non-use position by the rotation of the movable frame, thereby switching between the rolling part and the tapered roller while in use.

9 Claims, 11 Drawing Sheets

(56) References Cited

U.S. PATENT DOCUMENTS

| | | | | |
|---|---|---|---|---|
| 4,086,121 | A * | 4/1978 | Ames | B44C 7/06 |
| | | | | 156/526 |
| 4,208,239 | A * | 6/1980 | Lass | B44C 7/06 |
| | | | | 156/575 |
| 5,111,581 | A * | 5/1992 | Collins | B26B 1/048 |
| | | | | 30/158 |
| 5,114,527 | A * | 5/1992 | Stern | B44C 7/04 |
| | | | | 118/413 |
| 5,814,184 | A * | 9/1998 | Denkins | B65H 35/0033 |
| | | | | 156/577 |
| 5,915,792 | A * | 6/1999 | Sakurai | B26B 1/048 |
| | | | | 30/155 |
| 6,209,609 | B1 * | 4/2001 | Edwards | B65H 35/0033 |
| | | | | 156/577 |
| 6,513,562 | B1 * | 2/2003 | Trout | E04F 21/165 |
| | | | | 118/40 |
| 7,621,309 | B1 * | 11/2009 | Mondloch | B44C 7/06 |
| | | | | 156/526 |
| 10,308,468 | B1 * | 6/2019 | Wedekind | B65H 35/0053 |
| 2005/0055981 | A1 * | 3/2005 | Smythe | E04F 21/165 |
| | | | | 52/749.1 |
| 2007/0215289 | A1 * | 9/2007 | Kennedy | E04F 21/165 |
| | | | | 156/577 |
| 2013/0192765 | A1 * | 8/2013 | Owens | E04F 21/00 |
| | | | | 156/433 |
| 2016/0279919 | A1 * | 9/2016 | Jungklaus | E04F 21/026 |

* cited by examiner

CAULKING ASSISTING DEVICE

BACKGROUND OF INVENTION

1. Field of Invention

The present invention is a caulking assisting device, and more particularly a device that can switch between different rolling functions by the rotation of the movable frame.

2. Description of the Related Art

During the construction of general indoor fixtures on partitions, seams will always be formed at the joints, whether they are joined together using plates or by stacking walls. The general treatment method is to apply filling soil or adhesive to the joints in order to flatten the surface of wall joints, thereby achieving a smooth appearance with subsequent surface processing (e.g., painting).

However, while using conventional seam leveling tools for this operation, its point of application cannot be easily controlled on the wall surface, and the leveling effect after paste filling is relatively poor. Especially when the joint is located in a corner, it is relatively difficult to carry out construction works and achieve good leveling effect on the wall surface due to volume and construction angle limitations while using leveling tools.

Therefore, the inventor of the present invention has actively carried out research and improvements for years using his practical experiences in related designs. In addition, the inventor has created and tested physical samples many times, thereby improving the shortcomings mentioned above, and eventually completing the present invention.

SUMMARY OF THE INVENTION

To overcome the shortcomings above, the present invention offers a caulking assisting device, which can switch between a rolling part and a tapered roller by the rotation of the movable frame, thereby repairing different seam positions.

The present invention is a caulking assisting device has:

a fixed frame, which comprises a fixed plate and a pair of extended side plates; where the fixed plate is used for affixing a filler coating-supplying device, while each extended side plate comprises a first pin connection part, a second pin connection part, a first limiting recess and a second limiting recess;

a rolling part, which is pivoted to the first pin connection part on the pair of extended side plates, and protrudes through the bottom edge of the pair of extended side plates;

a movable frame, which comprises a pair of extended parts, an accommodating space, a pair of through holes and a pivotal part; where a tapered roller is pivoted at the end of the pair of extended parts, and the diameter of the tapered roller is tapered toward both sides; the pair of through holes are placed on both sides of the movable frame, while the pivotal part is pivoted to the second pin connection part on the pair of extended side plates, such that the movable frame is placed between the pair of extended side plates and rotate axially about the second pin connection part, thereby enabling the tapered roller to have at least a use position and a non-use position; and an elastic element, which is placed in the accommodating space of the movable frame, with a positioning protrusion on both ends, where the pair of positioning protrusions are placed respectively in the pair of through holes; when no external force is exerted, the elastic force of the elastic element prompts the pair of positioning protrusions to partially pass through the through holes, thus locking them to either the pair of first limiting recesses or the pair of second limiting recesses, and limiting the rotation of the movable frame; when a lateral pressure greater than the elastic force of the elastic element is exerted on the pair of positioning protrusions, the pair of positioning protrusions are withdrawn from either the pair of first limiting recesses or the pair of second limiting recesses and enter the through holes, such that the movable frame can rotate axially about the second pin connection part.

When the positioning protrusions are slotted to the first limiting recesses, the tapered roller is in the use position. When the positing protrusions are slotted to the second limiting recesses, the tapered roller is in the non-use position.

The following is a detailed description of specific embodiment and drawings, so that the review committee has a better understanding of the technical features of the present invention.

DETAILED DESCRIPTION OF THE PREFERRED EMBODIMENT

Referring to FIG. 1 to FIG. 4, the present invention is a type of caulking assisting device consisting of: a fixed frame 10, a rolling part 20, a movable frame 30 and an elastic element 40.

Figure 1:
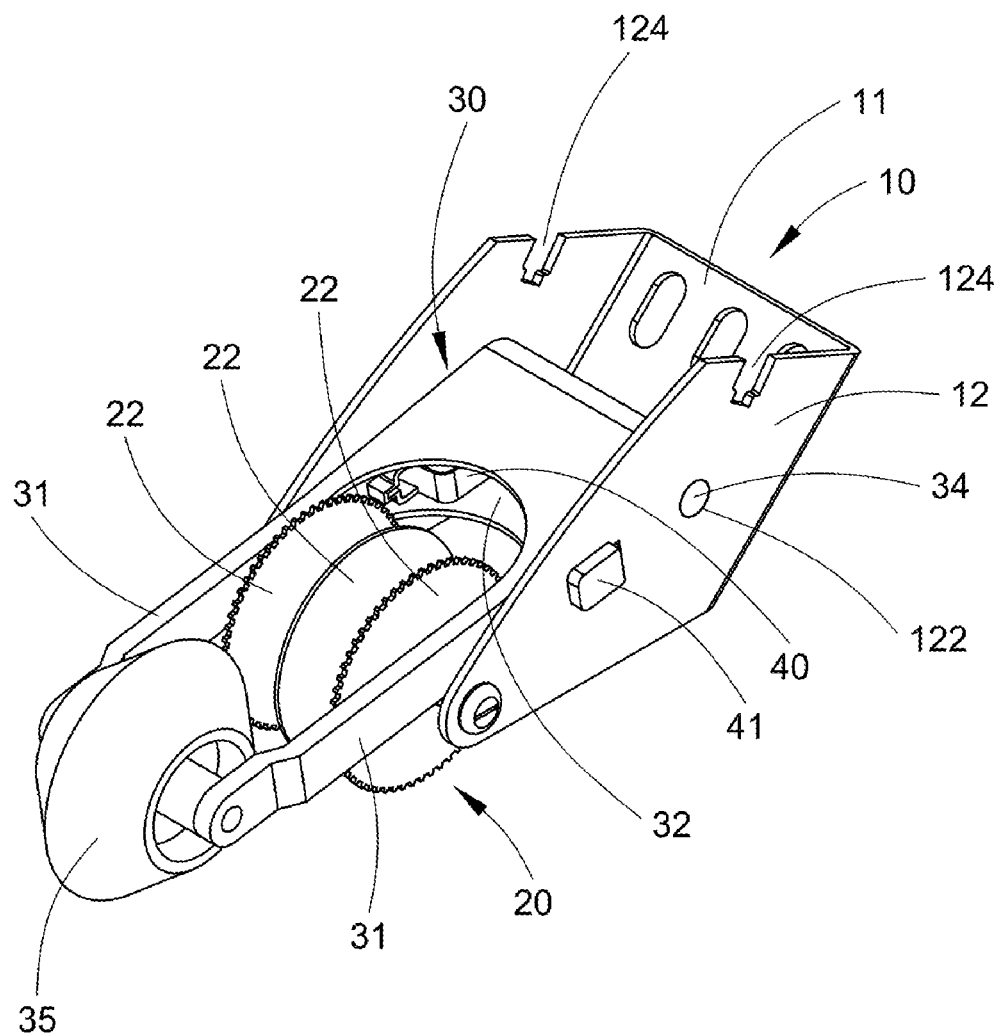
FIG. 1 shows the schematic drawing of the caulking assisting device in the present invention.
Figure 2A:
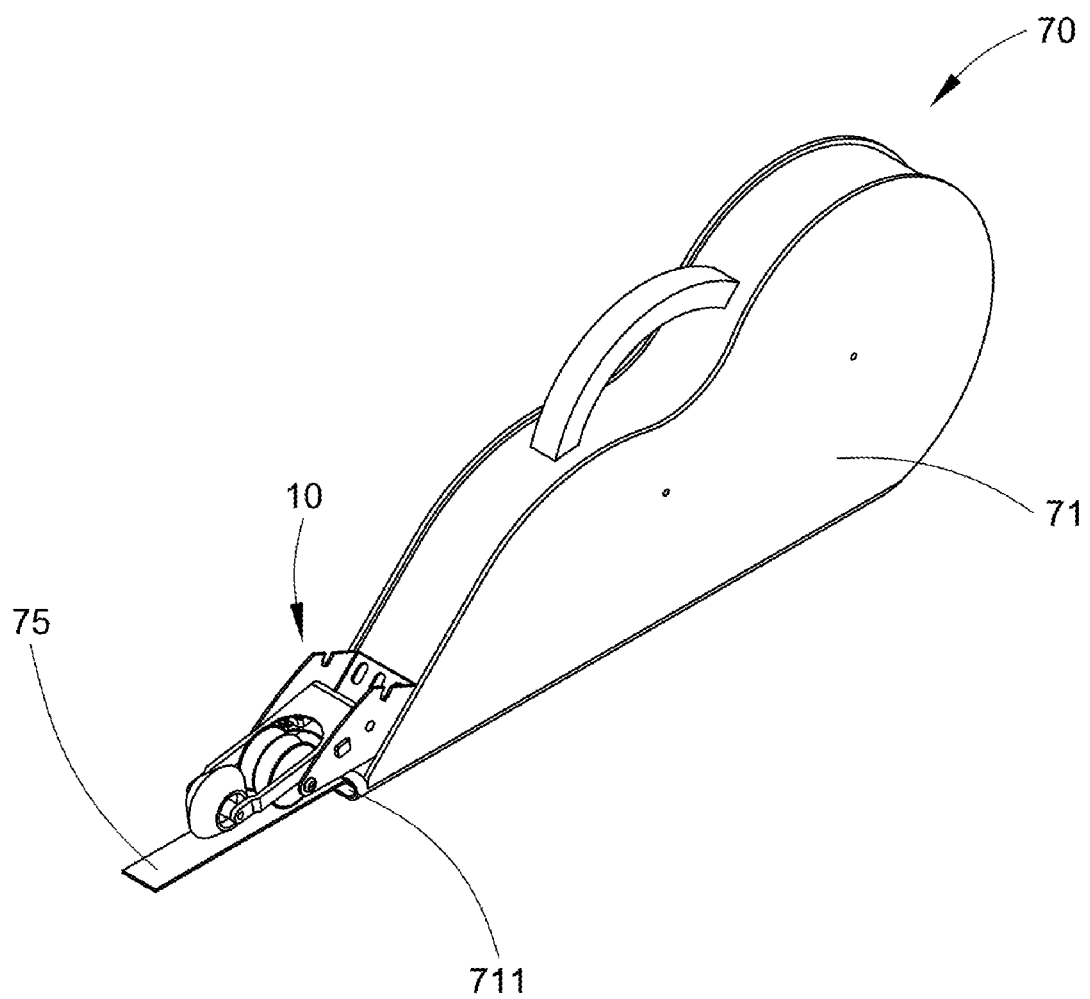
FIG. 2A shows the schematic drawing of the caulking assisting device in the present invention, which is mounted to the filler coating-supplying device.

With regard to the fixed frame 10, it comprises a fixed plate 11 and a pair of extended side plates 12. The fixed plate 11 forms an angle of more than 90 degrees with the bottom edge of the extended side plate 12. The fixed plate 11 is mounted to a filler coating-supplying device 70 (as shown in FIG. 2A) using the screw locking method, while each extended side plate 12 consists of a first pin connection part 121, a second pin connection part 122, a first limiting recess 123 and a second limiting recess 124. The first pin connection part 121 is located at the end of the extended side plate 12, while the first limiting recess 123 is located between the first pin connection part 121 and the second pin connection part 122. The second limiting recess 124 is adjacent to the fixed plate 11.

Figure 2B:
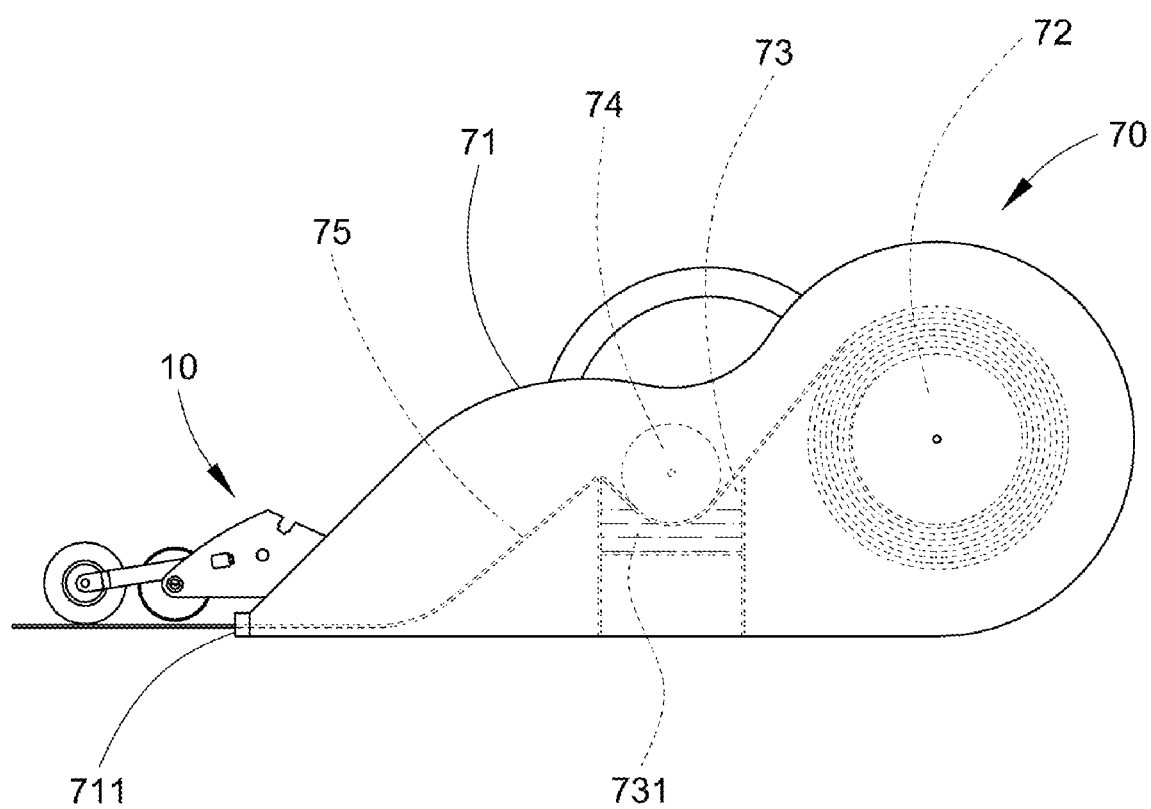
FIG. 2B shows the schematic drawing of the caulking assisting device in the present invention.

As shown in FIG. 2A and FIG. 2B, the filler coating-supplying device 70 consists of a casing 71, a supporting part 72, a coating supply tank 73, a loading roller 74 and a strip material 75. The casing 71 has an opening 711, while the fixed plate 11 on the fixed frame 11 is mounted to the casing 71 and is located above the opening 711. The coating supply tank 73 is placed in the casing 71 and is used for storing filler coating 731 (e.g., commercially available paste filler). The loading roller 74 is pivoted to the coating supply tank 73 and is rotatable, while the strip material 74 is wound on the supporting part 72 and around the outer edge surface of the loading roller 71.

The rolling part 20 is pivoted to the first pin connection 121 on the pair of extended side plates 12, and protrudes through the bottom edge of the pair of extended side plates 12. In the design of the embodiment, the rolling part 20 consists of a pivot shaft 21, three rollers 22 and four sleeves 23. Both ends of the pivot shaft 21 are pivoted to the first pin connection part 121 on the pair of extended side plates 12. Each sleeve 23 is of the same size and is connected by the pivot shaft 21, while each roller 22 is placed between two adjacent sleeves 23 and is connected to the pivot shaft 21, such that each roller 22 is equidistantly connected to the pivot shaft 21. Besides, rollers 22 which are placed on both outer sides have teeth on the outer edges.

Figure 5:
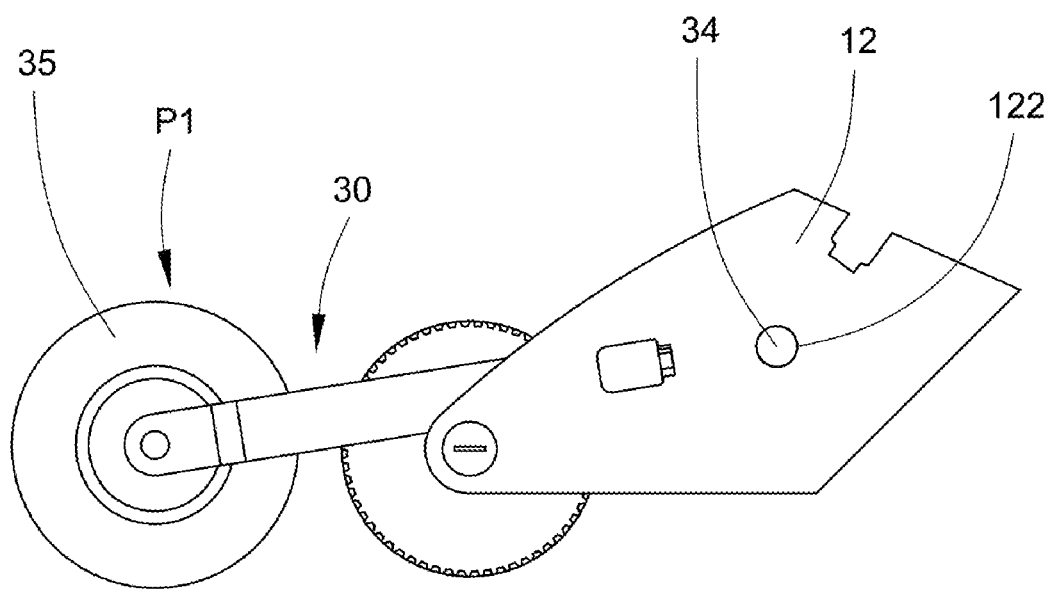
FIG. 5 shows the schematic drawing of the tapered roller in the present invention when the tapered roller is in the use position.
Figure 6:
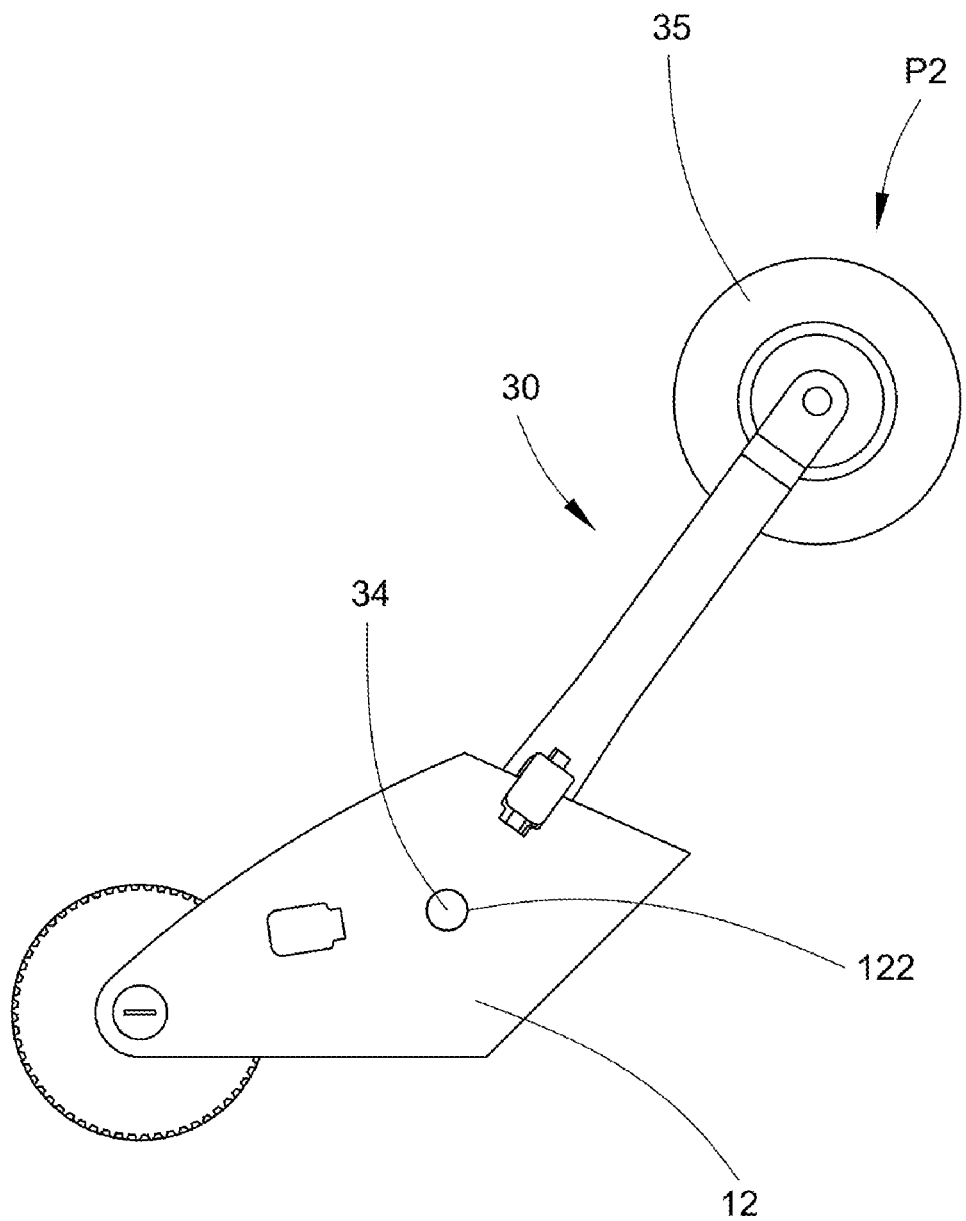
FIG. 6 shows the schematic drawing of the tapered roller in the present invention when the tapered roller is in the non-use position.

With regard to the movable frame 30, it consists of a pair of extended parts 31, an accommodating space 32, a pair of through holes 33, a pivotal part 34 and an engagement slot 36. A tapered roller 35 is pivoted to the end of the pair of extended pairs 31. The diameter of the tapered roller 35 is tapered toward both sides. The pair of through holes 33 extend through both sides of the movable frame 30 respectively, and connect to the accommodating space 32, while the pivotal part 34 is pivoted to the second pin connection part 122 on the pair of extended side plates 12, such that the movable frame 30 is placed between the pair of extended side plates 12 and rotate axially about the second pin connection part 122. As shown in FIG. 5 and FIG. 6, the movable frame 30 can rotate axially about the second pin connection 122 within a predetermined range, thereby driving the movement of the tapered roller 35 to a use position P1 and a non-use position P2. When the tapered roller 35 is in the use position P1, the tapered roller 35 is located at the front end of the roller 20. When the tapered roller 35 is in the non-use position P2, the tapered roller 35 is located above the roller 20.

Figure 3:
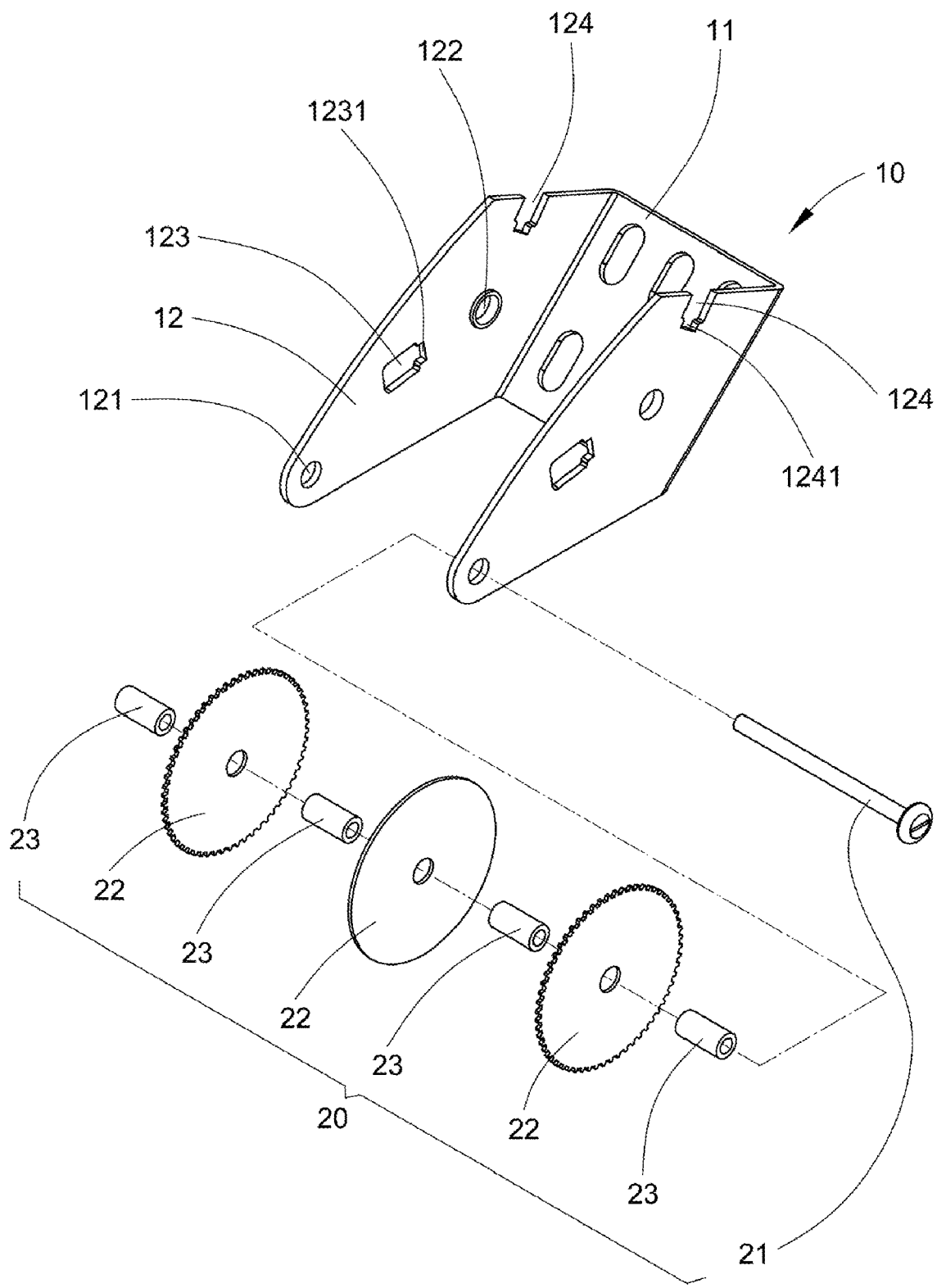
FIG. 3 shows the schematic assembly drawings of the fixed frame and the rolling part in the present invention.
Figure 4:
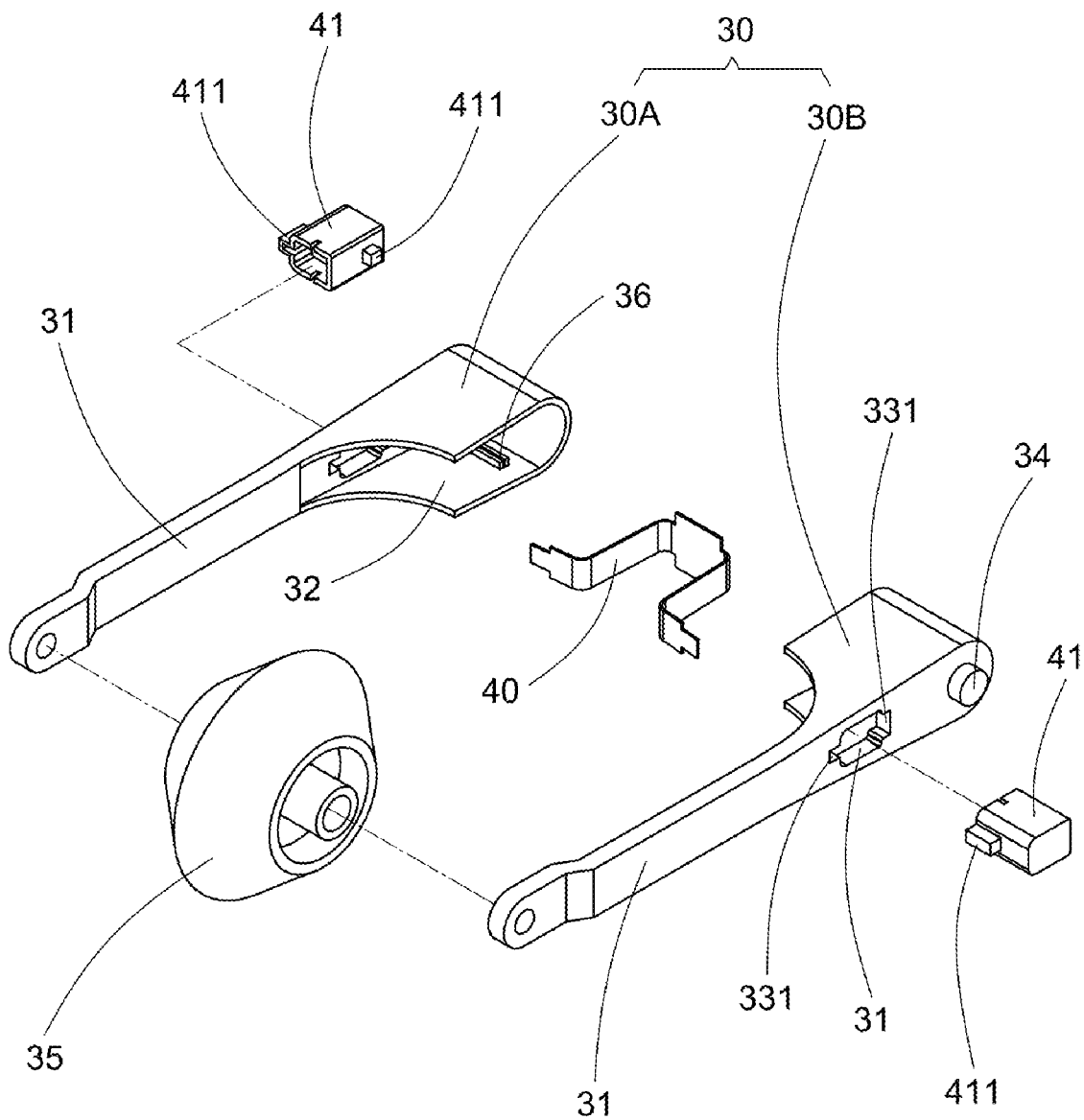
FIG. 4 shows the schematic drawing of the movable frame and the elastic element in the present invention.

As shown in FIG. 3, in this embodiment, the movable frame 30 is composed of the first member 30A and the second member 30B, which are symmetrical with each other. In practice, the movable frame 30 can also be combined into one piece or can be formed using other assembly methods.

The elastic element 40 is a metal shrapnel which is commonly seen in the market, and it is slotted to the engagement slot in the accommodating space 32. The elastic element 40 has a U shape in which both ends are bent and extended to both sides. Both its extended ends are connected to a positioning protrusion 41 respectively, and both positioning protrusions 41 pass through the pair of through holes 33 by the elastic force of the elastic element 40. When no external force is exerted, the elastic force of the elastic element 40 prompts the pair of positioning protrusions 41 to partially pass through the through holes 33 and locks them to either the pair of first limiting recesses 123 or the pair of the second limiting recesses 124, thereby limiting the rotation of the movable frame 30. When a lateral pressure greater than the elastic force of the elastic element 40 is exerted on the pair of positioning protrusions, the pair of positioning protrusions 41 are withdrawn from either the pair of first limiting recesses 123 or the pair of second limiting recesses 124 and enter the through holes 33, such that the movable frame 30 can rotate axially about the second pin connection part 122. At this moment, the movable frame can rotate axially about the second pin connection 122. Also, the engagement slot 36 on the movable frame is located in the accommodating space, and is used for fixing the position of the elastic element 40 (in practice, the elastic element can be placed in the engagement slot 32 using other fixing methods).

Figure 7A:
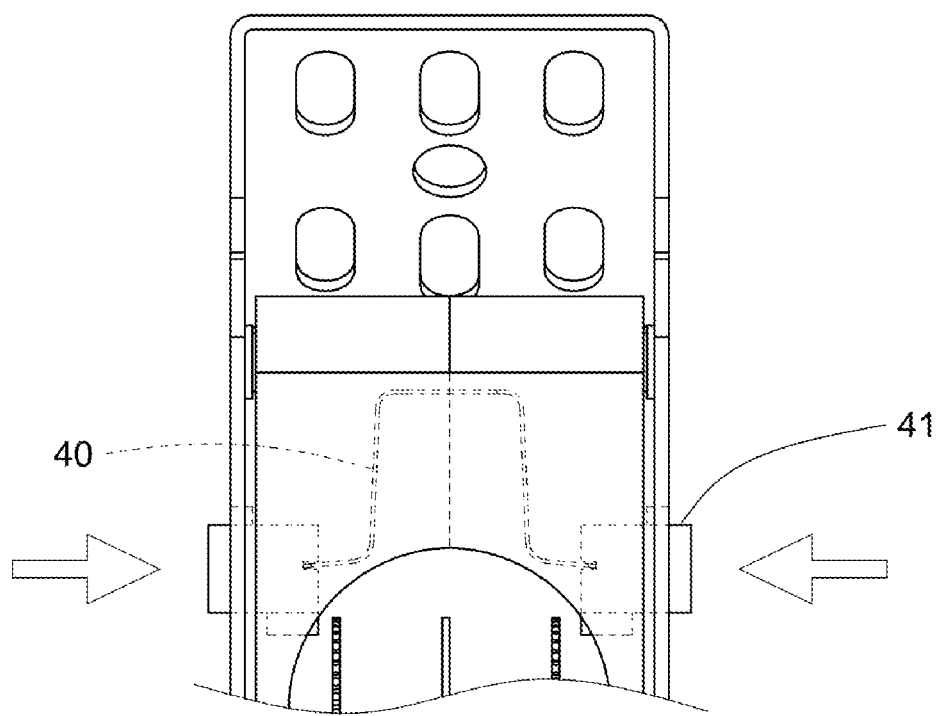
FIG. 7A shows the schematic drawing of the elastic element in the present invention when no external force is exerted.
Figure 7B:
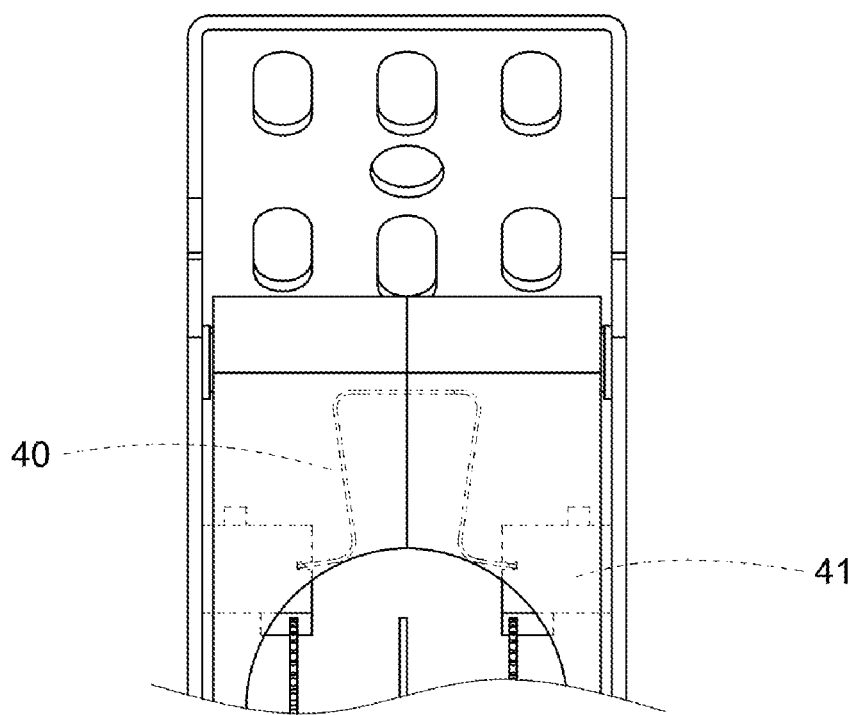
FIG. 7B shows the schematic diagram of the elastic element in the present invention when external force is exerted and the elastic element experiences elastic deformation.

As shown in FIG. 7A and FIG. 7B, when a lateral pressure greater than the elastic force of the elastic element 40 is exerted on the pair of positioning protrusions (indicated by the arrows in FIG. 7A), the elastic element 40 will experience elastic deformation, thereby withdrawing the pair of positioning protrusions 41 from either the pair of first limiting recesses 123 or the pair of second limiting recesses 124.

Hence, when the positioning protrusions 41 are locked to the first limiting recesses 123, the tapered roller 35 is in the use position P1. When the positioning protrusions 41 are locked to the second limiting recesses 124, the tapered roller 35 is in the non-use position P2. In this embodiment, the first limiting recesses 123 pass through the extended side plate 12, while the second limiting recesses 124 are disposed at the upper edge of the extended side plate 125.

The present invention adds a guiding design in its structure, which has the following advantages: A through hole guiding slot 331 is provided on both sides corresponding to the through holes 33 respectively. A first guiding slot 1231 is provided on one side of the first limiting recesses, while a second guiding slot 1241 is provided on one side of the second limiting recesses. A guiding protrusion 411 is provided on both sides corresponding to the positioning protrusions 41 respectively, while both guiding protrusions 411 are adjacent to both ends of the positioning protrusions 41, and pass through both through hole guiding slots 331. When the tapered roller 35 is in the use position P1, one of the guiding protrusions 411 corresponds to the first guiding slot 1231, while the other guiding protrusion 411 abuts the inner surface of the extended side plate 12 (which prevents the positioning protrusion 411 from being ejected from the fixed frame 10). When the tapered roller 35 is in the non-use position P2, one of the guiding protrusions 411 corresponds to the second guiding slot 1241. From here, this design not only can help to lock the positioning protrusions to the first limiting recesses 123 or the second limiting recesses 124 more tightly, but is also able to prevent them from being ejected. In addition, when the user presses the pair of positioning protrusions 41, the guiding effect ensures that the press is smooth and not easily displaced, thereby making it convenient to use.

Figure 8:
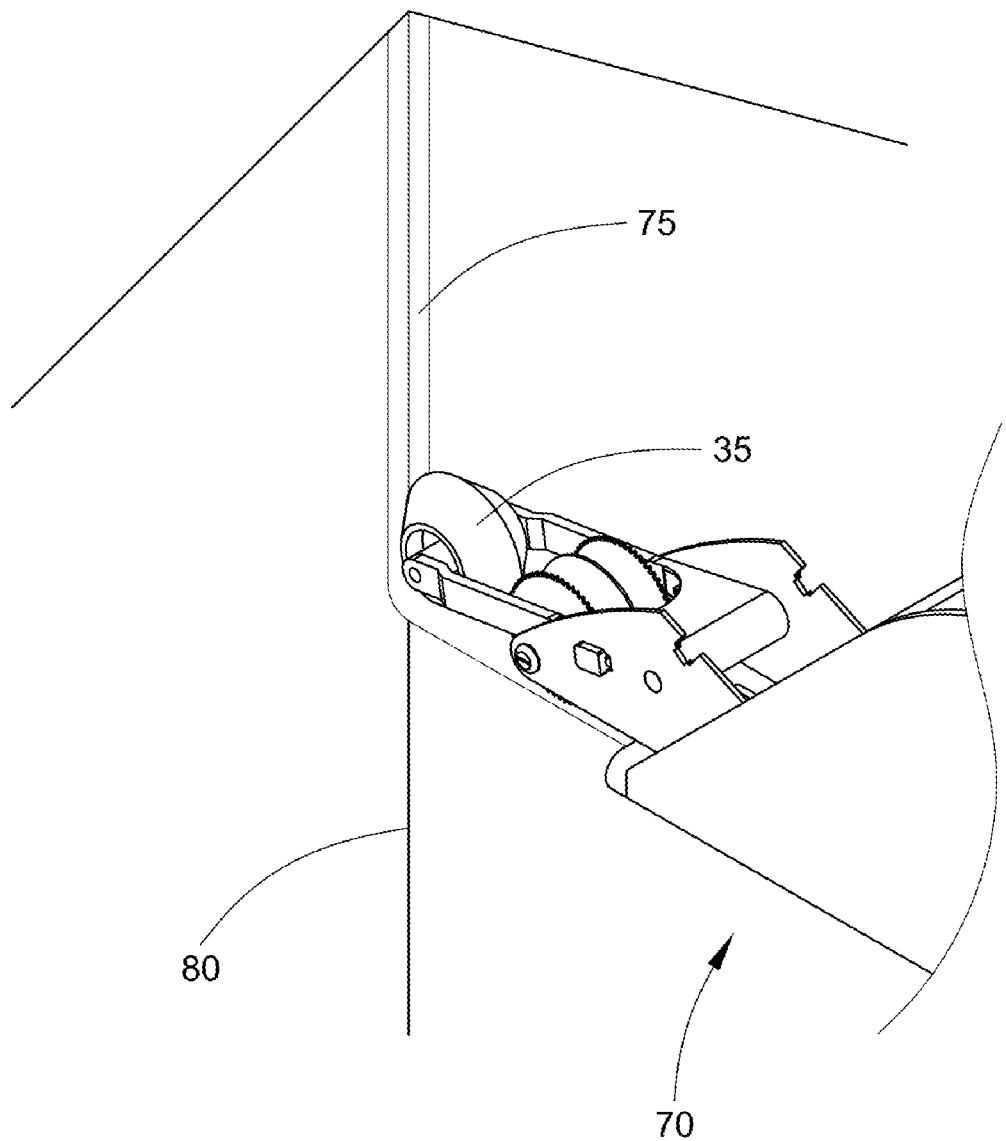
FIG. 8 shows the schematic drawing of the present invention when used on a corner seam.
Figure 9:
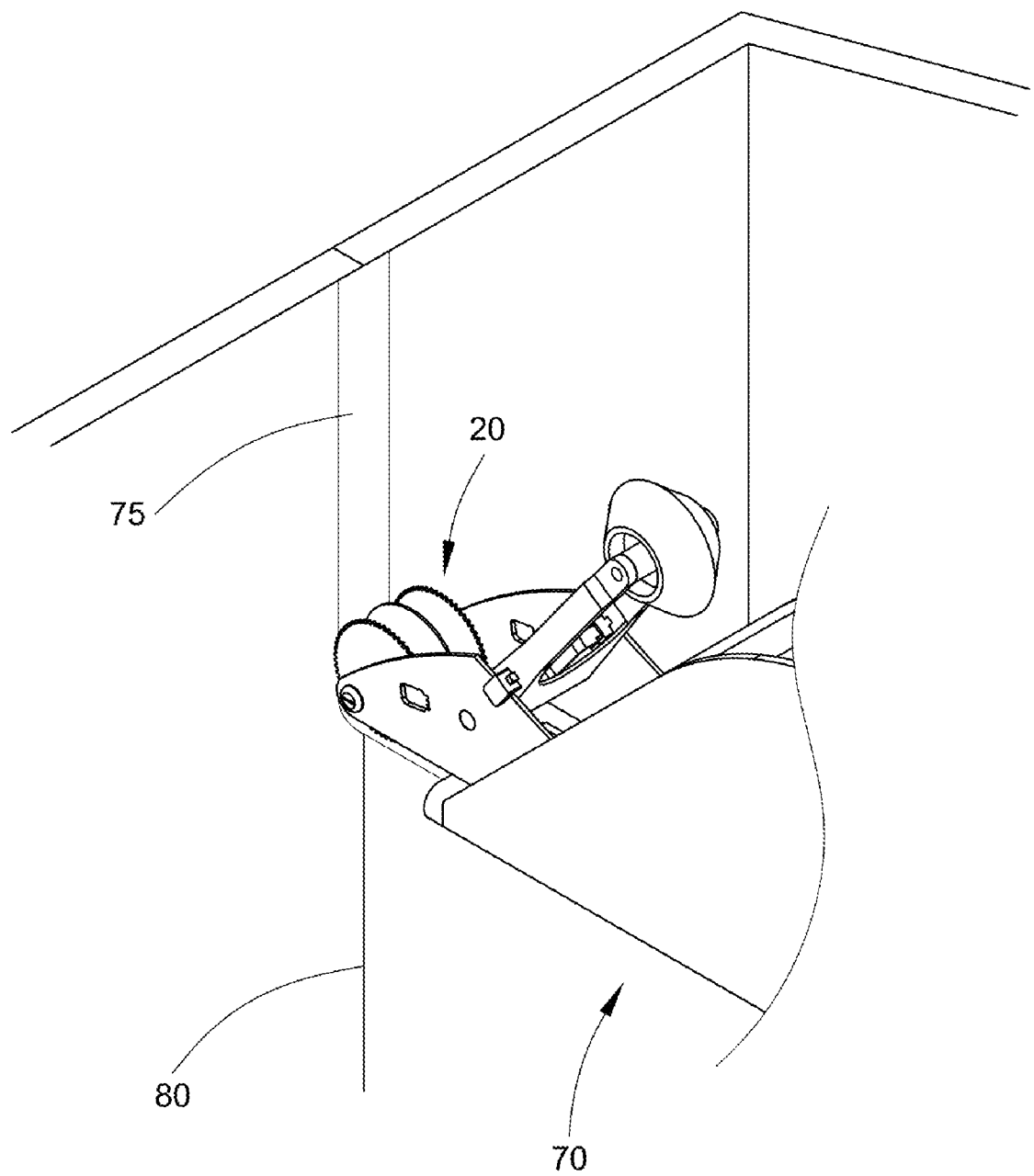
FIG. 9 shows the schematic diagram of the present invention when used on a flat seam.

More specifically, the present invention is applied to the repair of seams between two connected plates in general renovation works. First, the strip material 75 is pulled out from the opening 711 of the filler coating-supplying device, so that the bottom surface of the strip material is covered with filler material and attached to the wall seam 80. Then, using the roller 20 and the tapered roller 35, the strip coating on the bottom surface of the strip material 74 is pressed against the seam 80, thereby achieving the leveling effect on the wall seam. As shown in FIG. 8, the bottom surface of the strip material 75 which is covered with the filler material 731 is attached to the corner seam. Then, using the roller 20, the strip coating on the bottom surface of the strip material 74 is pressed against the seam 80. As shown in FIG. 9, the bottom surface of the strip material which is covered with the filler material is attached to the flat seam 80. Then, using the tapered roller 35, the strip coating on the bottom surface of the strip material 75 is pressed against the seam 80. In addition, FIG. 8 and FIG. 9 mainly show the rolling method in the present invention, while the filler material 731 on the bottom surface of the strip material is not shown in the diagrams.

Based on the description above, the present invention uses the rolling design of the rolling part 20 and the tapered roller 35 to push easily and achieve stable forward rolling effect, so that the filler coating 731 on the bottom surface of the strip material 75 can be pressed against the seam 80 in a flat and uniform manner. Besides, regardless of flat seam or corner seam, the present invention can switch the position of the movable frame 30 to enable the user to perform rolling using the appropriate rolling method.

The detailed description above enables those who are skilled in this art understand that the present invention can achieve the aforementioned purpose. As it has already complied with the provisions of the Patent Act, we would like to file a patent application for the present invention.

What is claimed is:

1. A caulking assisting device comprising:
a fixed frame having a fixed plate and a pair of extended side plates, the fixed plate being used for affixing a filler coating-supplying device, each extended side plate comprising a first pin connection part, a second pin connection part, a first limiting recess, and a second limiting recess, each first pin connection part located at an end of the respective extended side plate;
a rolling part rotatably connected to each first pin connection part on the pair of extended side plates, and extending from a bottom edge of the pair of extended side plates;
a movable frame having a pair of extended parts, an accommodating space, a pair of through holes and a pivotal part, a tapered roller rotatably connected to an end of the pair of extended parts, a diameter of the tapered roller tapering toward opposing sides, the pair of through holes are respectively disposed on opposite sides of the movable frame, the pivotal part pivoted to each second pin connection part on the pair of extended side plates, such that the movable frame is disposed between the pair of extended side plates and is rotatable axially about each second pin connection part, thereby enabling the tapered roller to have at least a use position and a non-use position; and
an elastic element disposed in the accommodating space of the movable frame, with a respective positioning protrusion on opposite ends, and the positioning protrusions are respectively capable of being placed in the pair of through holes;
wherein the elastic element elastically biases the positioning protrusions to partially pass through the pair of through holes to selectively lock the pair of through holes to either the first limiting recesses or the second limiting recesses, and limiting rotation of the movable frame;
when a lateral pressure greater than an elastic force of the elastic element is exerted on the positioning protrusions, the positioning protrusions are pushed from either the first limiting recesses or the second limiting recesses and enter the through holes, such that the movable frame can rotate axially about each second pin connection part; and
when the positioning protrusions are slotted to the first limiting recesses, the tapered roller is in the use position, and when the positing protrusions are slotted to the second limiting recesses, the tapered roller is in the non-use position.

2. A caulking assisting device as claimed in claim 1, wherein the fixed plate forms an angle of more than 90 degrees with the bottom edge of the pair of extended side plates.

3. A caulking assisting device as claimed in claim 1, wherein the rolling part comprises a pivot shaft and three rollers, and opposing ends of the pivot shaft are pivoted to each first pin connection part on the pair of extended side plates, while each of the three rollers is equidistantly connected to the pivot shaft.

4. A caulking assisting device as claimed in claim 3, wherein the rolling part further comprises four sleeves, and each sleeve is connected by the pivot shaft, while each roller is placed between two adjacent sleeves.

5. A caulking assisting device as claimed in claim 3, wherein outside rollers of the pivot shaft have teeth.

6. A caulking assisting device as claimed in claim 1, wherein the movable frame also comprises an engagement slot which is located in the accommodating space, and is used for fixing a position of the elastic element.

7. A caulking assisting device as claimed in claim 1, wherein the pair of extended parts are symmetrical with respect to each other.

8. A caulking assisting device as claimed in claim 1, wherein a through hole guiding slot is provided on both sides corresponding to the through holes respectively, while a first guiding slot is provided on one side of the first limiting recesses, and a second guiding slot is provided on one side of the second limiting recesses; a guiding protrusion is provided on both sides corresponding to the positioning protrusions respectively, while both guiding protrusions are adjacent to both ends of the positioning protrusions, and pass through both through hole guiding slots; wherein when the tapered roller is in the use position, one of the guiding protrusions corresponds to the first guiding slot, while the other guiding protrusion abuts an inner surface of the respective extended side plate, and when the tapered roller is in the non-use position, one of the guiding protrusions corresponds to the second guiding slot.

9. A caulking assisting device as claimed in claim 1 further comprising the filler coating-supplying device, wherein the filler coating-supplying device comprises a casing, a supporting part, a coating supply tank, a loading roller and a strip material, the casing comprises an opening, the fixed plate on the fixed frame mounted to the casing and located above the opening, the coating supply tank disposed in the casing and used for storing filler coating, and the loading roller is pivoted to the coating supply tank and is rotatable, while the strip material is wound on the supporting part and around an outer edge surface of the loading roller; wherein, after pulling out one end of the strip material from the opening, the bottom surface of the strip material is covered with the filler coating from the coating supply tank.

* * * * *